United States Patent
Yuan

(10) Patent No.: US 7,982,543 B1
(45) Date of Patent: Jul. 19, 2011

(54) SWITCHABLE POWER AMPLIFIER

(75) Inventor: Zhongjian Yuan, Portland, OR (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 86 days.

(21) Appl. No.: 12/414,495

(22) Filed: Mar. 30, 2009

(51) Int. Cl.
*H03F 3/68* (2006.01)

(52) U.S. Cl. .................................. 330/295; 330/124 R

(58) Field of Classification Search .............. 330/124 R, 330/295

See application file for complete search history.

(56) References Cited

U.S. PATENT DOCUMENTS

| | | |
|---|---|---|
| 5,152,004 A | 9/1992 | Vaisanen |
| 5,276,912 A | 1/1994 | Siwiak |
| 5,361,403 A | 11/1994 | Dent |
| 5,423,074 A | 6/1995 | Dent |
| 5,530,923 A | 6/1996 | Heinonen |
| 5,564,086 A | 10/1996 | Cygan |
| 5,661,434 A | 8/1997 | Brozovich |
| 5,758,269 A | 5/1998 | Wu |
| 5,774,017 A | 6/1998 | Adar |
| 5,909,643 A | 6/1999 | Aihara |
| 6,020,787 A | 2/2000 | Kim |
| 6,043,721 A | 3/2000 | Nagode |
| 6,069,525 A | 5/2000 | Sevic |
| 6,069,526 A | 5/2000 | Ballantyne |
| 6,242,986 B1 | 6/2001 | Adar |
| 6,271,722 B1 | 8/2001 | Ballantyne |
| 6,288,608 B1 | 9/2001 | Jadus |
| 6,313,700 B1 | 11/2001 | Nishijima |
| 6,377,117 B2 | 4/2002 | Oskowsky |
| 6,496,061 B1 | 12/2002 | Bloom |
| 6,501,331 B2 | 12/2002 | Adar |
| 6,515,541 B2 | 2/2003 | Cheng |
| 6,522,201 B1 | 2/2003 | Hsiao |
| 6,603,359 B2 | 8/2003 | Fujiwara |
| 6,700,439 B2 | 3/2004 | Jackson |
| 6,781,455 B2 | 8/2004 | Kim |
| 6,794,935 B2 | 9/2004 | Klomsdorf |
| 6,806,767 B2 | 10/2004 | Dow |
| 6,900,692 B2 | 5/2005 | Kim |
| 6,972,618 B2 | 12/2005 | Kim |
| 7,142,829 B2 | 11/2006 | Sung |
| 7,157,966 B2 * | 1/2007 | Baree et al. ............... 330/133 |
| 7,728,661 B2 * | 6/2010 | Bockelman et al. ........... 330/51 |
| 2005/0083117 A1 | 4/2005 | Kim |
| 2005/0099227 A1 | 5/2005 | Kim |
| 2007/0096804 A1 | 5/2007 | Bakalski |
| 2007/0096810 A1 | 5/2007 | Hageman |

OTHER PUBLICATIONS

Wright, Peter; "Prior Art Search on Variable Load Line PA Architectures;" Triquint Semiconductor, pp. 1-11; Sep. 28, 2007.

* cited by examiner

*Primary Examiner* — Robert Pascal
*Assistant Examiner* — Khiem D Nguyen
(74) *Attorney, Agent, or Firm* — Schwabe Williamson & Wyatt

(57) ABSTRACT

Embodiments of circuits, apparatuses, and systems for a switchable radio frequency (RF) power amplifier are disclosed. Some embodiments include a matching network configured to alternatively provide a first load impedance or second load impedance based at least in part on an amplification mode of a power amplification section. Other embodiments may be described and claimed.

19 Claims, 5 Drawing Sheets

7,982,543 B1

SWITCHABLE POWER AMPLIFIER

FIELD

Embodiments of the present disclosure relate generally to the field of circuits, and more particularly to a switchable power amplifier.

BACKGROUND

Power amplifiers for cellular handsets are optimized for efficiency at, or close to, maximum output power. However, in the field, they may only be called upon to operate near maximum output power for a very small percentage of the time. The rest of the time, they may be operating at back-off output power levels, where their direct current (DC) to radio-frequency (RF) conversion efficiency is very much reduced. This reduced efficiency under practical conditions results in wasted battery power in the handset and, therefore, reduced talk time.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Figure 1A:
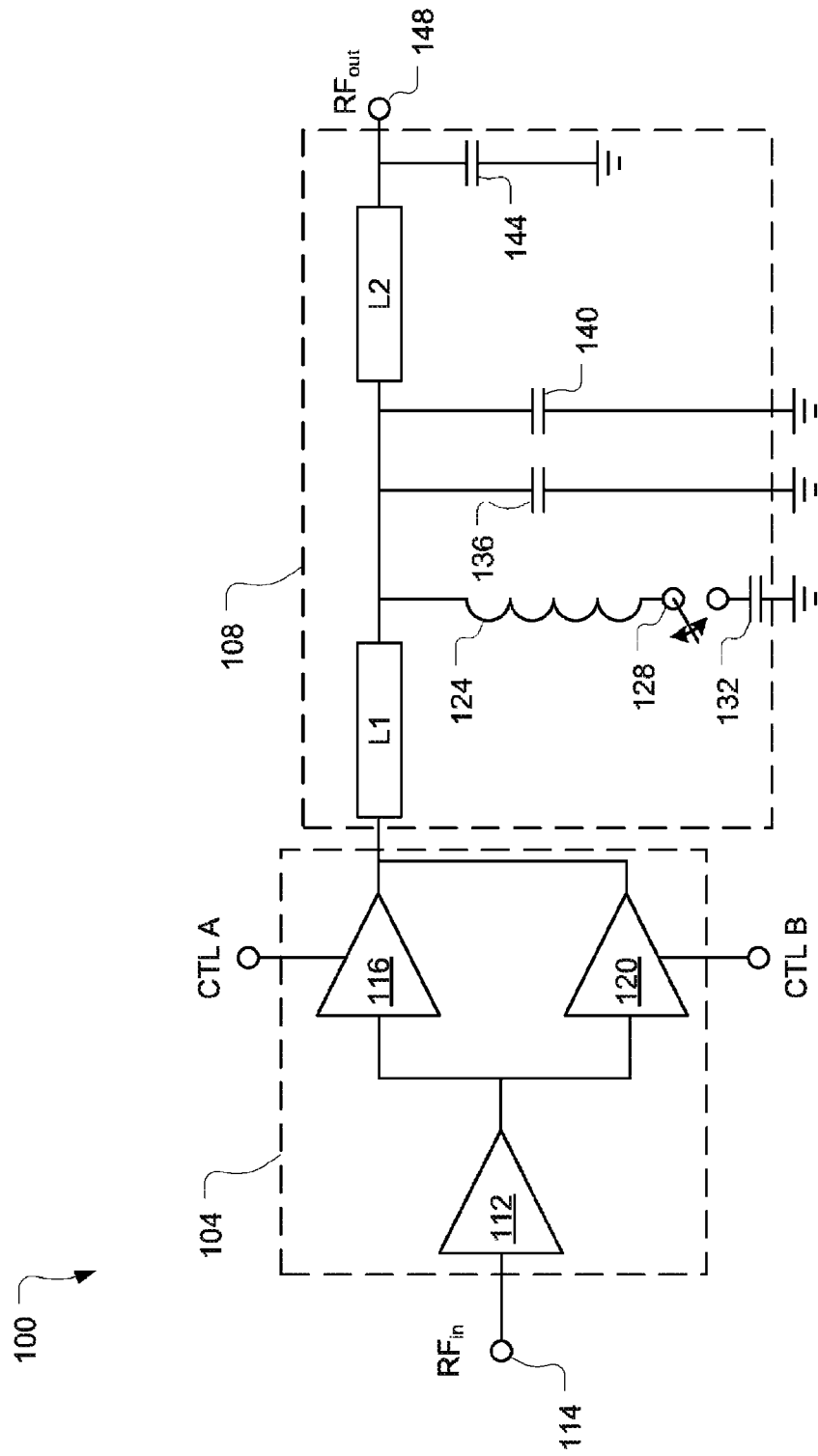
FIGS. 1a-1b illustrate amplification circuitry in accordance with various embodiments.

FIG. 1a illustrates amplification circuitry 100 in accordance with some embodiments of the present disclosure. The amplification circuitry 100 generally includes a power amplification section 104 coupled with a matching network 108.

The power amplification section 104 may include an input stage power amplifier (PA) 112 configured to receive an input radio frequency ($RF_{in}$) signal at an input port 114. The input stage PA 112 may perform some initial amplification and provide an intermediate amplified signal to two output stage PAs, e.g., output stage PA 116 and output stage PA 120, which are coupled in parallel with one another as shown. One or more intermediate stages may be coupled between the input stage PA 112 and the output stage PAs 116 and 120. Additionally, more than two output stage PAs may be coupled in parallel in other embodiments.

The output stage PAs 116 and 120 may be configured to be complementarily controlled to alternatively place the power amplification section 104, and the amplification circuitry 100, in general, in a first amplification mode or a second amplification mode. The control of the output stage PAs 116 and 120 may be affected by a control signal CTL A coupled with output stage PA 116 and control signal CTL B coupled with output stage PA 120.

Figure 1B:
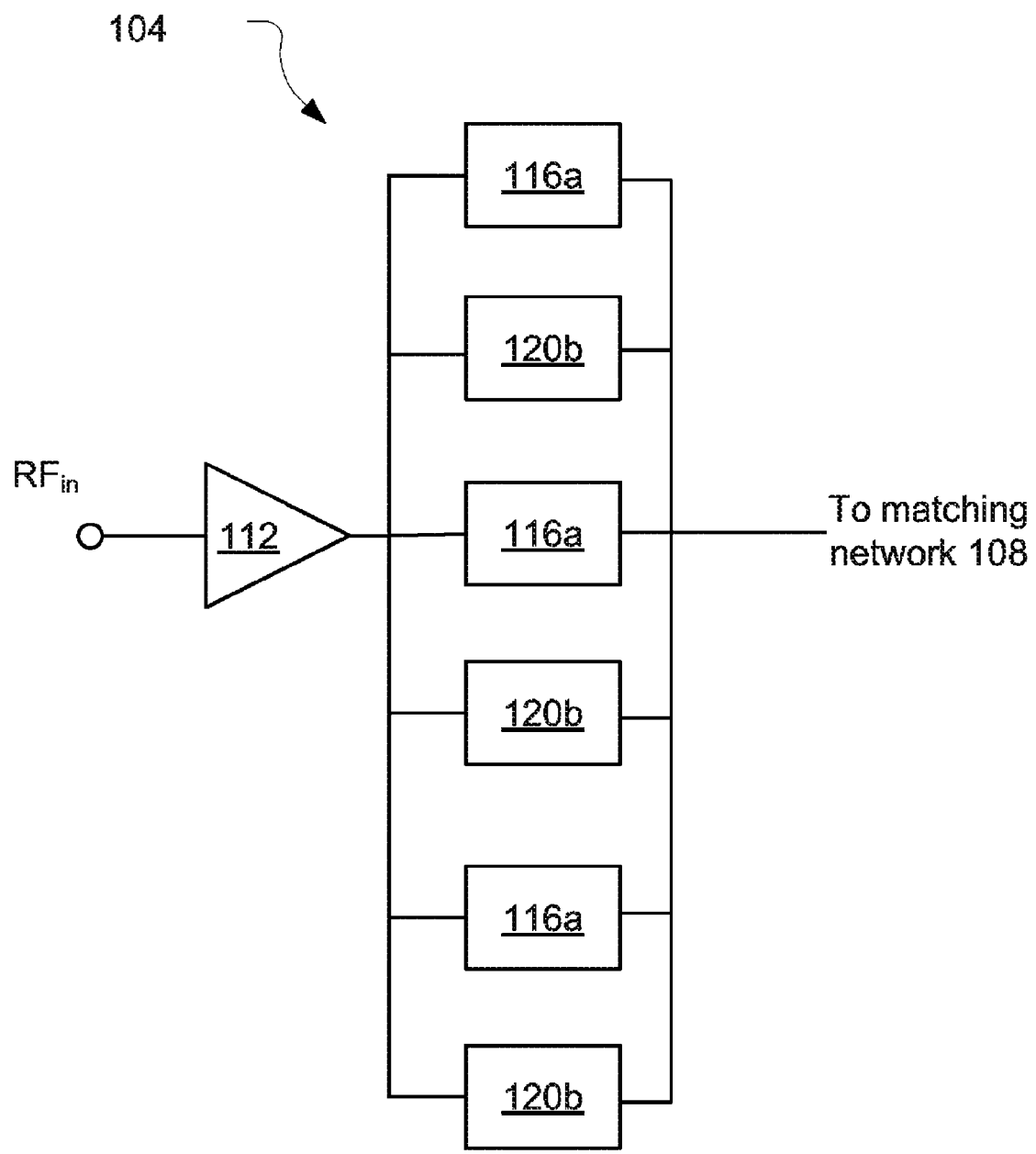

Each of the output stage PAs 116 and 120 may include an array of transistors. In some embodiments, and as shown in FIG. 1b, the transistors 116a, of output stage PA 116 may be interleaved with the transistors, 120b of output stage PA 120. This may reduce an imbalance in magnitude and phase of the amplified signals.

In some embodiments, the transistors of the PAs 112, 116 and 120 may be field-effect transistors, e.g., heterostructure field-effect transistors (HFETs), metal-semiconductor field-effect transistors (MESFETs), high electron mobility transistors (HEMTs) (e.g., GaAs pseudomorphic HEMTs, aluminum gallium nitride (AlGaN)/GaN HEMTs and all their derivatives, etc.), etc. Other embodiments may use other transistor technologies such as, but not limited to, bipolar junction transistor (BJT) technology, e.g., heterojunction bipolar transistors (HBTs).

The matching network 108 includes a number of spurs off of a main line. The first spur has a first inductor 124, a switch 128, and a DC-blocking capacitor 132. A number of additional spurs may each have a corresponding capacitor, e.g., capacitor 136, capacitor 140, and capacitor 144. Line impedances of various line segments may be represented by L1 and L2. L1 and L2 may include inductors, e.g., spiral inductors on a substrate or discrete components. The matching network 108 may provide an output RF ($RF_{out}$) signal at an $RF_{out}$ port 148. The $RF_{out}$ signal may be a version of the $RF_{in}$ signal that is amplified by a desired amount.

The components of the amplification circuitry 100 may be formed on a gallium arsenide (GaAs) chip. However, other embodiments may use chips including other semiconductor materials, e.g., silicon, indium phosphide, silicon carbide, etc.

Figure 2:
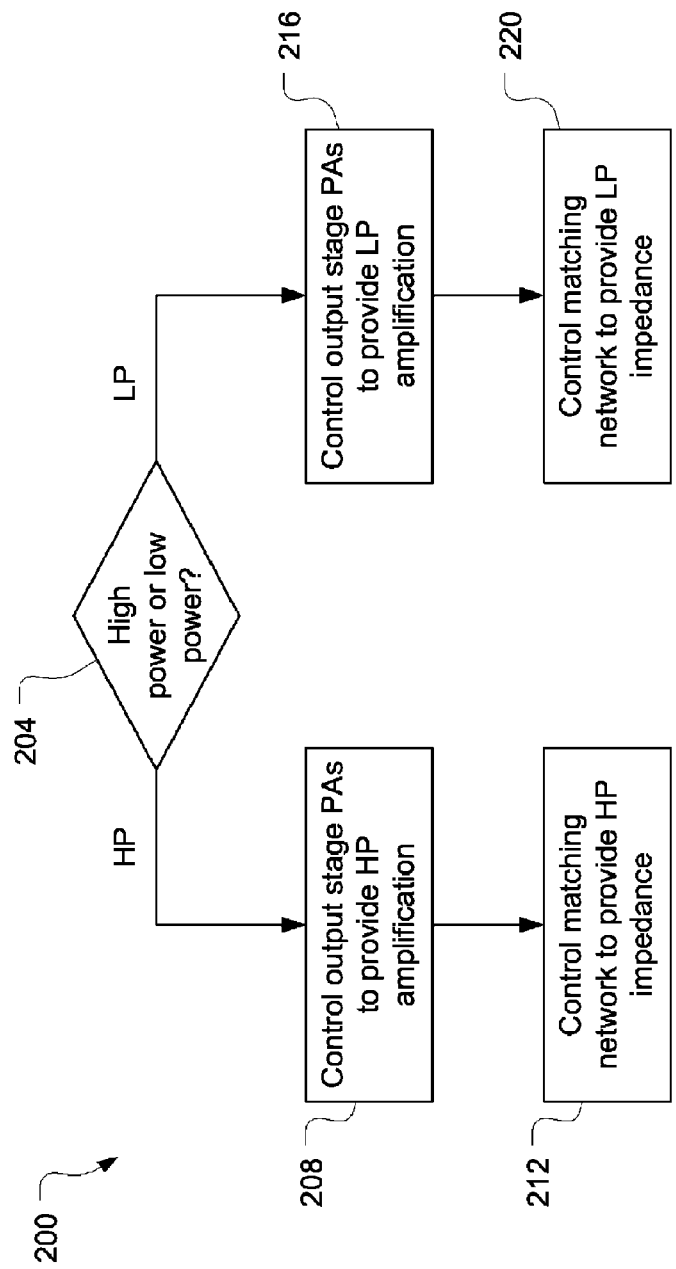
FIG. 2 is a flowchart describing operation of amplification circuitry in accordance with various embodiments.

FIG. 2 is a flowchart 200 describing operation of the amplification circuitry 100 in accordance with some embodiments. At block 204, it may be determined whether the amplification circuitry 100 is to be operating in a first amplification mode, e.g., a high power (HP) mode, or a second amplification mode, e.g., a low power (LP) mode. While two modes are discussed, it is understood that in various embodiments any number of modes may be utilized. In some embodiments, the first and second amplification modes may be two points, or ranges, on a continuum of amplification levels provided by the amplification circuitry 100.

Figure 4:
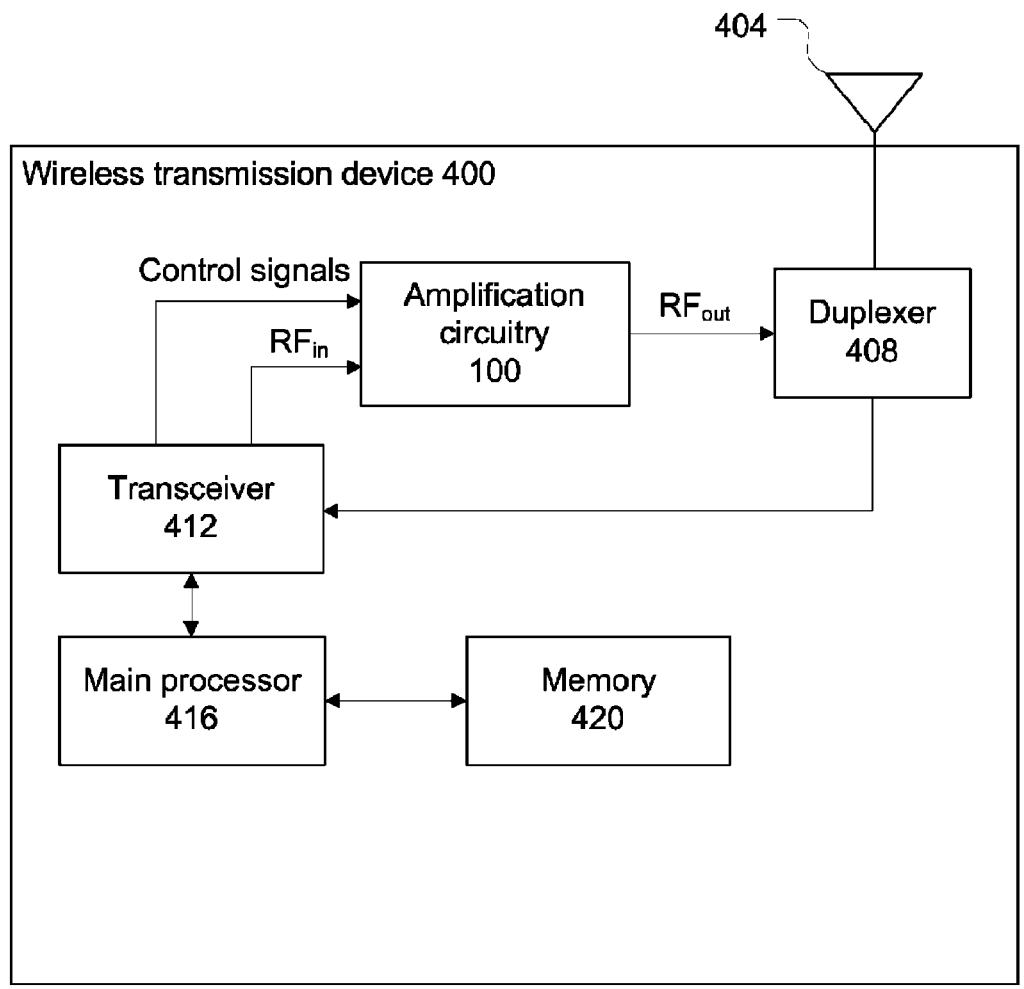
FIG. 4 illustrates a wireless transmission device implementing amplification circuitry in accordance with various embodiments.

If it is determined, at block 204, that the amplification circuitry 100 is to be operating in the HP mode, a controller, e.g., transceiver 412 of FIG. 4, may adjust the CTL A and CTL B signals such that both of the output stage PAs 116 and 120 are operating in a manner to provide HP amplification, at block 208. In some embodiments, it may be that the controller adjusts the CTL A and CTL B signals such that both of the output stage PAs 116 and 120 are activated in the HP mode.

While the power amplification section 104 is providing HP amplification, the controller may also control the matching network 108 to provide HP impedance, at block 212. In an embodiment in which the amplification circuitry 100 is employed in a global system for mobile communications (GSM) power amplifier of a mobile unit, the amplification circuitry 100 may deliver approximately 35 dBm to a load at the $RF_{out}$ port 148. In this case, it may be desirable for the HP impedance seen by the output stage PAs to be about 2 ohms and slightly inductive. This may be accomplished by opening the switch 128 to take the inductor 124 out of the matching network 108. In some embodiments, the DC-to-RF conversion efficiency of the amplification circuitry 100 operating in the HP amplification mode and controlling both the power amplification section 104 and the matching network 108, as described, may be approximately 55%.

If, at block 204, it is determined that the amplification circuitry 100 is to be operating in the LP amplification mode, the controller may adjust the CTL A and CTL B signals such that both the output stage PAs 116 and 120 are operating in a manner to provide LP amplification, at block 216. In some embodiments, it may be that the controller adjusts the CTL A and CTL B signals such that only one of the output stages, e.g., output stage PA 116, is activated in the LP amplification mode. The other output stage PA, e.g., output stage PA 120, may be deactivated.

While the power amplification section 104 is providing LP amplification, the controller may also control the matching network 108 to provide LP impedance, at block 220. In the embodiment in which the amplification circuitry 100 is employed in the GSM power amplifier of the mobile unit, discussed above, the amplification circuitry 100 may deliver approximately 31 dBm to the load at the $RF_{out}$ port 148. In this case, it may be desirable for the LP impedance seen by the output stage PA 116 to be about 5 ohms. This may be accomplished by closing the switch 128 to place the inductor 124 in the matching network 108. Switching the inductor 124 into the matching network 108 reduces the overall capacitance of the matching network 108 by effectively tuning out capacitance provided to the matching network 108 from the capacitor 136 and capacitor 140. In some embodiments, the DC-to-RF conversion efficiency of the amplification circuitry 100 operating in the LP amplification mode and controlling both the amplification section 104 and the matching network 108, as described, may be approximately 45%.

The desired signal amplification may be achieved at relatively high efficiencies while the amplification circuitry 100 is operating in the HP mode or the LP mode, when the power amplification section 104 and matching network 108 are controlled in this manner. This may, in turn, decrease the overall power consumption of the amplification circuitry 100. For example, the 45% DC-to-RF conversion efficiency of the amplification circuitry 100 operating in the LP mode may be compared to a conventional amplification circuit's DC-to-RF conversion efficiency of approximately 30%. At this level, the described embodiment may provide an estimated current savings of about 300 milliamps (mA) over the conventional amplification circuit.

Figure 3:
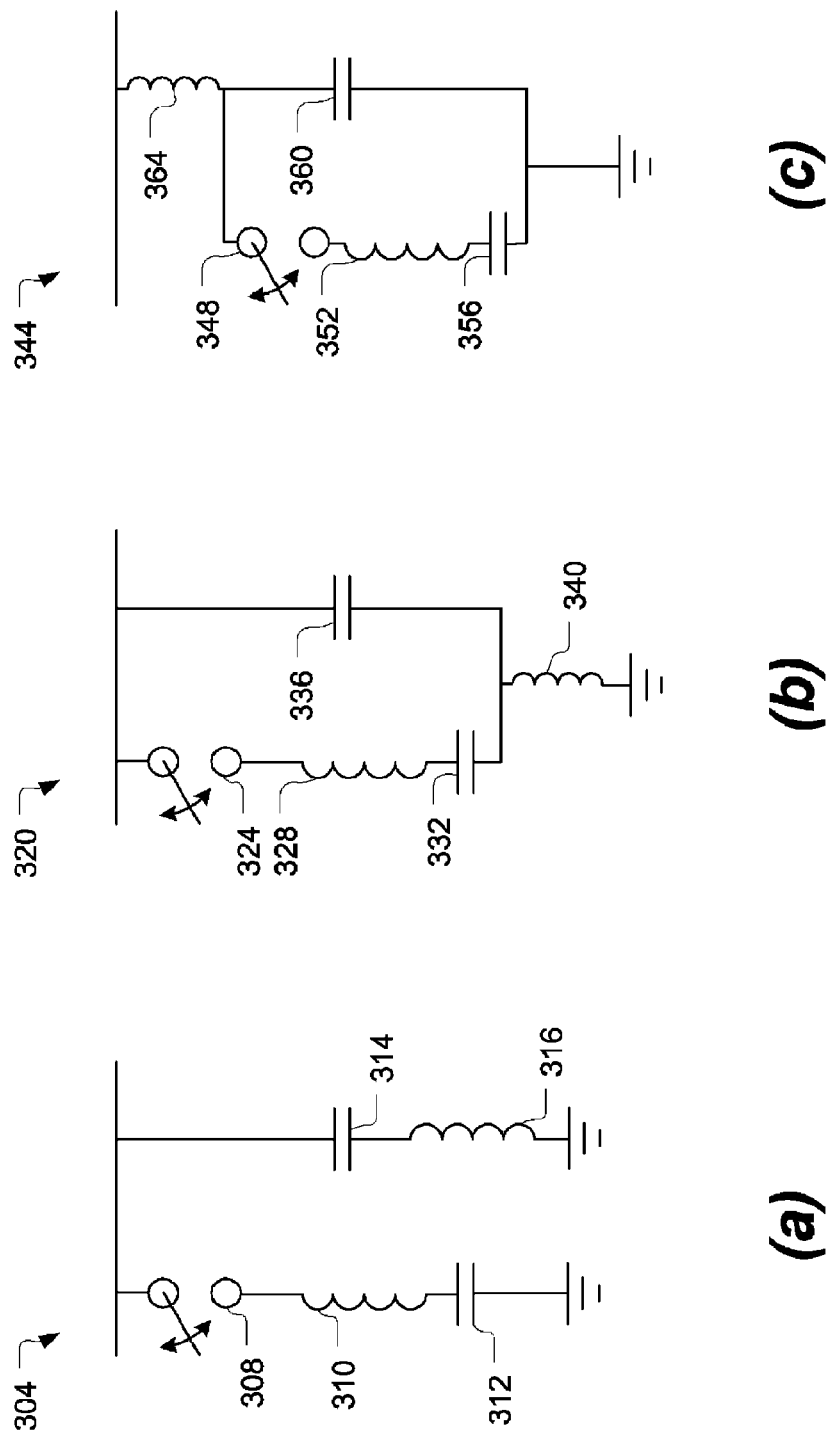
FIGS. 3a-3c illustrate a number of tuning variants that may be used in amplification circuitry in accordance with various embodiments.

FIG. 3 illustrates a number of L/C tuning variants in accordance with various embodiments. The tuning variants shown in FIG. 3 may be substantially interchangeable with the arrangement of the inductor 124, switch 128, DC-blocking capacitor 132, and capacitor 136 shown in FIG. 1.

FIG. 3(a) illustrates an L/C tuning variant 304 in accordance with some embodiments. The L/C tuning variant 304 may have a switch 308, an inductor 310, and a DC-blocking capacitor 312 on a first spur, similar to the spur of matching network 108 having the inductor 124, switch 128, and DC-blocking capacitor 132. The L/C tuning variant 304 may have a second spur that has a capacitor 314, similar to the spur of matching network 108 having the capacitor 136. However, in this embodiment, the spur may also include an inductor 316, which may be used to suppress harmonics generated by the amplification circuitry 100.

FIG. 3(b) illustrates an L/C tuning variant 320 in accordance with some embodiments. The L/C tuning variant 320 may have a switch 324, an inductor 328, and a DC-blocking capacitor 332 coupled in parallel with a capacitor 336, similar to the matching network 108. However, in this embodiment, both lines may be coupled with ground through an inductor 340.

FIG. 3(c) illustrates an L/C tuning variant 344 in accordance with some embodiments. The L/C tuning variant 344 may have a switch 348, an inductor 352, and a DC-blocking capacitor 356 coupled in parallel with a capacitor 360, similar to the matching network 108. However, in this embodiment, both lines may be coupled with a main line through an inductor 364.

The amplification circuitry 100 may be incorporated into any of a variety of apparatuses and systems. A block diagram of an exemplary wireless transmission device 400 incorporating the amplification circuitry 100 is illustrated in FIG. 4. In addition to the amplification circuitry 100, the wireless transmission device 400 may have an antenna structure 404, a duplexer 408, a transceiver 412, a main processor 416, and a memory 420 coupled with each other at least as shown. While the wireless transmission device 400 is shown with transmitting and receiving capabilities, other embodiments may include wireless transmission devices without receiving capabilities.

In various embodiments, the wireless transmission device 400 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting RF signals.

The main processor 416 may execute a basic operating system program, stored in the memory 420, in order to control the overall operation of the wireless transmission device 400. For example, the main processor 416 may control the reception of signals and the transmission of signals by transceiver 412. The main processor 416 may be capable of executing other processes and programs resident in the memory 420 and may move data into or out of memory 420, as desired by an executing process.

The transceiver 412 may receive outgoing data (e.g., voice data, web data, e-mail, signaling data, etc.) from the main processor 416, may generate the $RF_{in}$ signal to represent the outgoing data, and provide the $RF_{in}$ signal to the amplification circuitry 100. The transceiver 412 may also provide one or more control signals, e.g., CTL A and/or CTL B, to the amplification circuitry 100.

The amplification circuitry 100 may amplify the $RF_{in}$ signal in accordance with the amplification mode determined by the control signals. The amplified $RF_{out}$ signal may be forwarded to the duplexer 408 and then to the antenna structure 404 for an over-the-air (OTA) transmission.

In a similar manner, the transceiver 412 may receive an incoming OTA signal from the antenna structure 404 through the duplexer 408. The transceiver 412 may process and send the incoming signal to the main processor 416 for further processing.

In various embodiments, the antenna structure 404 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless transmission device 400 is given by way of example and that, for simplicity and clarity, only so much of the construction and operation of the wireless transmission device 400 as is necessary for an understanding of the embodiments is shown and described. Various embodiments contemplate any suitable component or combination of components performing any suitable tasks in association with wireless transmission device 400, according to particular needs. Moreover, it is understood that the wireless transmission device 400 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
a power amplification section having a first output stage power amplifier (PA) and a second output stage PA coupled, in parallel, with one another and configured to be complementarily controlled to alternatively place the power amplification section in a first amplification mode or a second amplification mode; and
a matching network having only one signal path coupled with the power amplification section, the signal path including a single line coupled with an output of the first output stage PA and an output of the second output stage PA,
wherein the matching network is configured to alternatively provide a first load impedance at the single line or a second load impedance at the single line based at least in part on whether the power amplification section is in the first amplification mode or the second amplification mode.

2. The circuit of claim 1, wherein the first output stage PA and the second output stage PA are configured to be complementarily controlled such that the first output stage PA is activated and the second output stage PA is deactivated while the power amplification section is in the second amplification mode and both the first output stage PA and the second output stage PA are activated in the first amplification mode.

3. The circuit of claim 1, wherein the first output stage PA includes a first transistor array and the second output stage PA includes a second transistor array that is interleaved with the first transistor array.

4. The circuit of claim 1, wherein the matching network is configured to provide a first load impedance when the PA section is in a first amplification mode and a second load impedance when the PA section is in a second amplification mode.

5. The circuit of claim 1, wherein the matching network further comprises:
a first spur coupled with the single line and having an inductor, a first capacitor, and a switch coupled, in series, with one another, the switch configured to open to provide the first load impedance and close to provide the second load impedance;
a second spur coupled with the single line and having a second capacitor; and
a third spur coupled with the single line and having a third capacitor.

6. The circuit of claim 5, wherein the inductor is configured to tune out capacitance provided to the matching network by the second capacitor.

7. The circuit of claim 6, wherein the inductor is further configured to tune out capacitance provided to the matching network by the third capacitor.

8. The circuit of claim 5, wherein the matching network further comprises:
one or more additional spurs, each having a respective capacitor.

9. The circuit of claim 5, wherein the inductor is a first inductor and the first spur is coupled in parallel with the second spur and both the first spur and the second spur are coupled, in series, with a second inductor.

10. The circuit of claim 9, wherein the second inductor is between a ground and the first and second spurs.

11. The circuit of claim 9, wherein the second inductor is between the single line and the first and second spurs.

12. The circuit of claim 5, wherein the inductor is a first inductor and the second spur further includes a second inductor coupled, in series, with the second capacitor.

13. A method comprising:
controlling a first output stage power amplifier (PA) and a second output stage PA, which are coupled in a parallel with one another, in a manner to set an amplification circuitry in a first amplification mode or a second amplification mode; and
controlling a matching network, having only one signal path coupled with the power amplification section, the signal path including a single line coupled with the first output stage PA and the second output stage PA, the controlling of the matching network to provide a first load impedance on the single line or a second load impedance on the single line based at least in part on whether the amplification circuitry is set in the first amplification mode or the second amplification mode.

14. The method of claim 13, wherein said controlling the first output stage PA and the second output stage PA comprises:
  activating both the first output stage PA and the second output stage PA to set the amplification circuitry in the first amplification mode; and
  activating the first output stage PA and deactivating the second output stage PA to set the amplification circuitry in the second amplification mode.

15. The method of claim 13, wherein said controlling the matching network comprises:
  providing a first load impedance when the amplification circuitry is in the first amplification mode; and
  providing a second load impedance when the amplification circuitry is in the second amplification mode.

16. A system comprising:
  a transceiver configured to provide a radio frequency signal and one or more control signals;
  amplification circuitry coupled with the transceiver to receive the RF signal and the one or more control signals and configured to output an amplified RF signal, the amplification circuitry including
    a power amplification section having a first output stage power amplifier (PA) and a second output stage (PA) coupled, in parallel, with one other and configured to be complementarily controlled by the one or more control signals to alternatively place the amplification circuitry in a first amplification mode or a second amplification mode; and
    a matching network having only one signal path coupled with the power amplification section, the signal path including a single line coupled with an output of the first output stage PA and an output of the second output stage PA, the matching network being configured to provide a switchable impedance on the single line based at least in part on whether the PA section is in the first amplification mode or the second amplification mode; and
  an antenna structure coupled with the amplification circuitry and configured to facilitate an over-the-air (OTA) transmission of the amplified RF signal.

17. The system of claim 16, wherein the first output stage PA and the second output stage PA are configured to be complementarily controlled such that the first output stage PA is activated and the second output stage PA is deactivated while the power amplification section is in the second amplification mode and both the first output stage PA and the second output stage PA are activated in the first amplification mode.

18. A system comprising:
  a transceiver configured to provide a radio frequency signal and one or more control signals;
  amplification circuitry coupled with the transceiver to receive the RF signal and the one or more control signals and configured to output an amplified RF signal, the amplification circuitry including
    a power amplification section having a first output stage power amplifier (PA) and a second output stage (PA) coupled, in parallel, with one other and configured to be complementarily controlled by the one or more control signals to alternatively place the amplification circuitry in a first amplification mode or a second amplification mode, wherein the first output stage PA includes a first transistor array and the second output stage PA includes a second transistor array that is interleaved with the first transistor array; and
    a matching network having only one signal path coupled with the power amplification section, the signal path including a single line coupled with an output of the first output stage PA and an output of the second output stage PA, the matching network being configured to provide a switchable impedance on the single line based at least in part on whether the PA section is in the first amplification mode or the second amplification mode; and
  an antenna structure coupled with the amplification circuitry and configured to facilitate an over-the-air (OTA) transmission of the amplified RF signal.

19. The system of claim 16, wherein the matching network is configured to provide a first load impedance when the power amplification section is in a first amplification mode and a second load impedance when the PA section is in a second amplification mode.

* * * * *